(12) United States Patent
Lee

(10) Patent No.: US 10,608,175 B2
(45) Date of Patent: *Mar. 31, 2020

(54) RESISTANCE CHANGE DEVICE HAVING ELECTRODE DISPOSED BETWEEN RESISTANCE SWITCHING LAYER AND FERROELECTRIC LAYER

(71) Applicant: SK hynix Inc., Icheon-si (KR)

(72) Inventor: Sanghun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/016,550

(22) Filed: Jun. 23, 2018

(65) Prior Publication Data

US 2019/0181336 A1 Jun. 13, 2019

(30) Foreign Application Priority Data

Dec. 7, 2017 (KR) .......................... 10-2017-0167841

(51) Int. Cl.
*H01L 45/00* (2006.01)
*H01L 27/24* (2006.01)

(52) U.S. Cl.
CPC ............ *H01L 45/085* (2013.01); *H01L 45/12* (2013.01); *H01L 45/1233* (2013.01); *H01L 45/1246* (2013.01); *H01L 45/1266* (2013.01); *H01L 27/2463* (2013.01); *H01L 45/143* (2013.01); *H01L 45/144* (2013.01); *H01L 45/146* (2013.01)

(58) Field of Classification Search
CPC .............. H01L 45/085; H01L 45/1233; H01L 45/1246; H01L 45/1266; H01L 45/143; H01L 45/144; H01L 45/146
See application file for complete search history.

(56) References Cited

U.S. PATENT DOCUMENTS

| | | | |
|---|---|---|---|
| 6,720,599 B2 * | 4/2004 | Higuchi .................. | G11C 11/22 257/295 |
| 8,687,401 B2 | 4/2014 | Jiang et al. | |
| 9,053,801 B2 * | 6/2015 | Sandhu .................... | G11C 11/22 |
| 2007/0194367 A1 * | 8/2007 | Moon ..................... | B82Y 10/00 257/314 |
| 2015/0269984 A1 * | 9/2015 | Elmegreen .............. | G11C 11/22 365/145 |
| 2016/0064659 A1 * | 3/2016 | Cho ........................ | H01L 45/08 711/113 |
| 2016/0149129 A1 * | 5/2016 | Bodke ................. | H01L 27/2409 257/4 |
| 2017/0316822 A1 * | 11/2017 | Sei ........................ | H01L 27/105 |
| 2018/0269216 A1 * | 9/2018 | Lee ..................... | H01L 27/2418 |
| 2018/0358410 A1 * | 12/2018 | Lee .................... | G11C 13/0007 |

FOREIGN PATENT DOCUMENTS

KR 10-2013-0111754 A 10/2013

* cited by examiner

*Primary Examiner* — Stephen W Smoot

(57) ABSTRACT

A resistance change device according to an embodiment of the disclosure includes a first electrode, a resistance switching layer disposed on the first electrode, a second electrode disposed on the resistance switching layer, a ferroelectric layer disposed on the second electrode, and a third electrode disposed on the ferroelectric layer.

20 Claims, 16 Drawing Sheets

RESISTANCE CHANGE DEVICE HAVING ELECTRODE DISPOSED BETWEEN RESISTANCE SWITCHING LAYER AND FERROELECTRIC LAYER

CROSS-REFERENCE TO RELATED APPLICATION

The present application claims priority under 35 U.S.C 119(a) to Korean Patent Application No. 10-2017-0167841, filed on Dec. 7, 2017, which is herein incorporated by reference in its entirety.

BACKGROUND

1. Technical Field

Various embodiments of the present disclosure generally relate to a semiconductor device, and more particularly, relate to a resistance change device.

2. Related Art

Generally, a resistance change device refers to a device whose internal resistance variably changes by an externally applied voltage or current. In addition, the resistance change device can store a plurality of pieces of logic information by recording the changed resistance in a nonvolatile manner.

Meanwhile, the resistance change device can be classified into a resistive random access memory (ReRAM) device, a phase change random access memory (PCRAM) device, a magnetic random access memory (MRAM) device and the like according to a method of changing the internal resistance.

SUMMARY

There is provided a resistance change device having an improved data retention characteristic according to one aspect of the present disclosure. The resistance change device includes a first electrode, a resistance switching layer disposed on the first electrode, a second electrode disposed on the resistance switching layer, a ferroelectric layer disposed on the second electrode, and a third electrode disposed on the ferroelectric layer.

There is provided a resistance change device having an improved data retention characteristic according to another aspect of the present disclosure. The resistance change device includes a first electrode, a resistance switching layer, a second electrode, a ferroelectric layer having a remanent polarization, and a third electrode that are sequentially disposed. The resistance switching layer has an electrical resistance that varies depending on whether a conductive filament connecting the first and second electrodes to each other is formed in the resistance switching layer. The remanent polarization generates an electric field that induces an inflow of electrons from at least one of the first and second electrodes into the conductive filament when the conductive filament is generated in the resistance switching layer.

DETAILED DESCRIPTION

Figure 1:
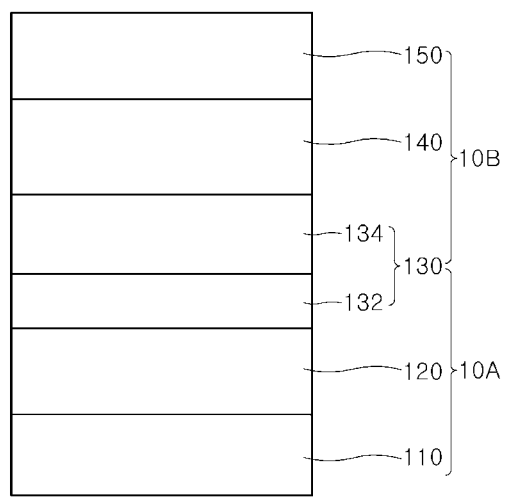
FIG. 1 is a cross-sectional view schematically illustrating a resistance change device according to an embodiment of the present disclosure.
Figure 1:
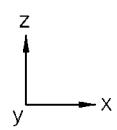

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

In this specification, "lower" or "upper" is not an absolute concept but may be a relative concept that can be interpreted by replacing "upper" or "lower", respectively, depending on the view point of the observer.

In this specification, the terms of "low resistance state" and "high resistance state" are not interpreted as absolute concepts having respective predetermined actual resistance values, but can be interpreted as relative concepts for identifying each other. As an example, in a resistance change device that implements a logic signal differentiated from "0" and "1", the low resistance state and the high resistance state are used to represent logic signal values of "0" and "1".

FIG. 1 is a cross-sectional view schematically illustrating a resistance change device 1 according to an embodiment of the present disclosure. Referring to FIG. 1, the resistance change device 1 may include a resistance change element 10A and a ferroelectric element 10B. The resistance change element 10A and the ferroelectric element 10B may be electrically connected in series to each other. In an embodiment, the resistance change element 10A may include a first electrode 110, a resistance switching layer 120 and a second electrode 130. The ferroelectric element 10B may include the second electrode 130, a ferroelectric layer 140 and a third electrode 150. The second electrode 130 may be shared by the resistance change element 10A and the ferroelectric element 10B.

Although not illustrated, the resistance change element 10A and the ferroelectric element 10B may have a predetermined or set width extending in a y-direction and a predetermined or set length along an x-direction, respectively. As an example, the resistance change element 10A and the ferroelectric element 10B may have a cross-sectional area formed on a plane defined by a longitudinal direction parallel to the x-direction and a width direction parallel to the y-direction.

Although not illustrated, the first electrode 110 may be disposed on a substrate. The substrate may include, for example, a semiconductor material. Specifically, the substrate may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate, as non-limiting examples. A plurality of integrated circuits may be disposed on the substrate. Multilayered conductive layers and insulating layers may be disposed between the substrate and the first electrode 110.

The first electrode 110 may include a conductive material. The conductive material may include metal, metal nitride, metal oxide, doped silicon, conductive carbon structure, or a combination of two or more thereof, as non-limiting examples. The first electrode 110 may include gold (Au), platinum (Pt), aluminum (Al), ruthenium (Ru), titanium (Ti), iridium (Ir), tungsten (W), titanium nitride (TiN), tantalum nitride (TaN), ruthenium oxide ($RuO_2$), p-type or n-type doped polysilicon, copper nanotubes and the like, as non-limiting examples. The first electrode 110 may be disposed in the form of a single film or a multilayered layer structure. A thickness of the first electrode 110 may be determined by considering an electrical resistance of the first electrode 110. As the thickness of the first electrode 110 increases, the electrical resistance of the first electrode 110 may increase. As an example, the thickness of the first electrode 110 may be one (1) nm to ten (10) nm. As another example, the thickness of the first electrode 110 may be one (1) nm to one hundred (100) nm.

The resistance switching layer 120 may be disposed on the first electrode 110. The resistance switching layer 120 may have at least two resistance states that can be distinguished from each other. In an embodiment, the at least two resistance states of resistance switching layer 120 may be changed by the application of an operating voltage. After the operating voltage is applied and the resistance state changes, the changed resistance state may be stored in the resistance switching layer 120 in a nonvolatile manner even after the operating voltage is removed.

In an embodiment, metal ions supplied from a metal supply layer 132, which will be described layer, flow into resistance switching layer 120. The metal ions may be reduced and may generate or form a conductive filament that connects the first electrode 110 to the second electrode 130. When the conductive filament is formed, the resistance switching layer 120 can switch from a relatively high resistance state as an initial state to a low resistance state.

The resistance switching layer 120 may include, for example, a chalcogenide-based material, or metal oxide. The resistance switching layer 120 may include aluminum oxide, hafnium oxide, tantalum oxide, titanium oxide, zinc oxide, silicon oxide, germanium-tellurium (Ge—Te), germanium-selenium-tellurium (Ge—Se—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), germanium-tellurium-tin-platinum (Ge—Te—Sn—Pt), or a combination of two or more thereof, as non-limiting examples. The resistance switching layer 120 may have, for example, a thickness of one (1) nm to ten (10) nm.

The second electrode 130 may be disposed on the resistance switching layer 120. The second electrode 130 may include the metal supply layer 132 and an electrode layer 134. The metal supply layer 132 may interface with or be disposed on the resistance switching layer 120. In an embodiment, the second electrode 130 may be a layer structure in which the metal supply layer 132 and the electrode layer 134 are sequentially stacked on resistance switching layer 120.

The metal supply layer 132 may supply metal ions that may enter or migrate into the resistance switching layer 120 when a positive bias having a predetermined or sufficient magnitude is externally applied to the metal supply layer 132. The metal ions can be generated by oxidizing the metal in the metal supply layer 132 by the positive bias. The metal supply layer 132 may include copper (Cu), silver (Ag), copper-tellurium (Cu—Te) alloy, silver-tellurium (Ag—Te) alloy, or a combination of two or more thereof, as non-limiting examples. The metal supply layer 132 may have a conductive property. A thickness of the metal supply layer 132 may be designed taking into account the total resistance of the second electrode 130, the amount or number of the metal ions supplied into the resistance switching layer 120, or the like. In an embodiment, as the thickness of the metal supply layer 132 increases, the electrical resistance of the second electrode 130 may increase, and the amount of the metal ions that migrate into resistance switching layer 120 may also increase. As an example, the metal supply layer 132 may have a thickness of one (1) nm to ten (10) nm.

The electrode layer 134 may be disposed on the metal supply layer 132. A configuration of the electrode layer 134 may be substantially the same as a configuration of the first electrode 110. A thickness of the electrode layer 134 may be chosen depending on the total resistance of the second electrode 130. In an embodiment, as the thickness of the electrode layer 134 increases, the electrical resistance of the second electrode 130 also increases. As an example, the metal supply layer 132 may have a thickness of one (1) nm to ten (10) nm.

The ferroelectric layer 140 may be disposed on the second electrode layer 130. The ferroelectric layer 140 may have polarization aligned in different directions depending on the magnitude or direction of the electric field applied from the outside to the ferroelectric layer 140. In addition, after the applied electric field is removed, the polarization formed by the electric field can be stored in a non-volatile manner as remanent polarization. The remanent polarization may spatially separate negative electric charges and positive electric charges from each other in the ferroelectric layer 140. The separated negative electric charges and positive electric charges may form an electric field on the resistance change device 1. As shown in FIGS. 4B, 5B and 6B to be described later, the negative electric charges and the positive electric charges may be respectively disposed in an interface region with the different layers 134 and 150 which are in contact with the ferroelectric layer 140.

The ferroelectric layer 140 may have an insulating property when a voltage less than a predetermined or set threshold voltage is applied and may have electrical conductivity by tunneling conduction when a voltage equal to or higher than the threshold voltage or higher is applied. The ferroelectric layer 140 may have a thickness of, for example, one (1) nm to thirty (30) nm. The ferroelectric layer 140 may include hafnium oxide, zirconium oxide, hafnium zirconium oxide, or a combination of two or more thereof, as non-limiting examples.

The third electrode 150 may be disposed on the ferroelectric layer 140. The third electrode 150 may have substantially the same configuration as the first electrode 110 or the electrode layer 134. The third electrode 150 may be disposed in the form of a single layer or a multilayer structure. A thickness of the third electrode 150 may be determined by consideration of the electrical resistance of the third electrode 150. In an embodiment, as the thickness of the third electrode 150 increases, the electrical resistance of the third electrode 150 increases. As an example, the thickness of the third electrode 150 may be one (1) nm to ten (10) nm. As another example, the thickness of the third electrode 150 may be one (1) nm to one hundred (100) nm.

Figure 2A:
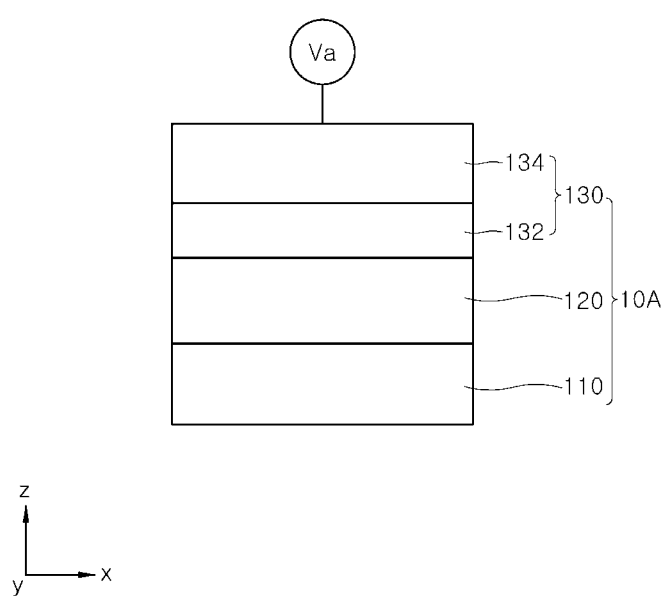
FIG. 2A is a view schematically illustrating a method of operating a resistance change element according to an embodiment of the present disclosure.
Figure 2B:
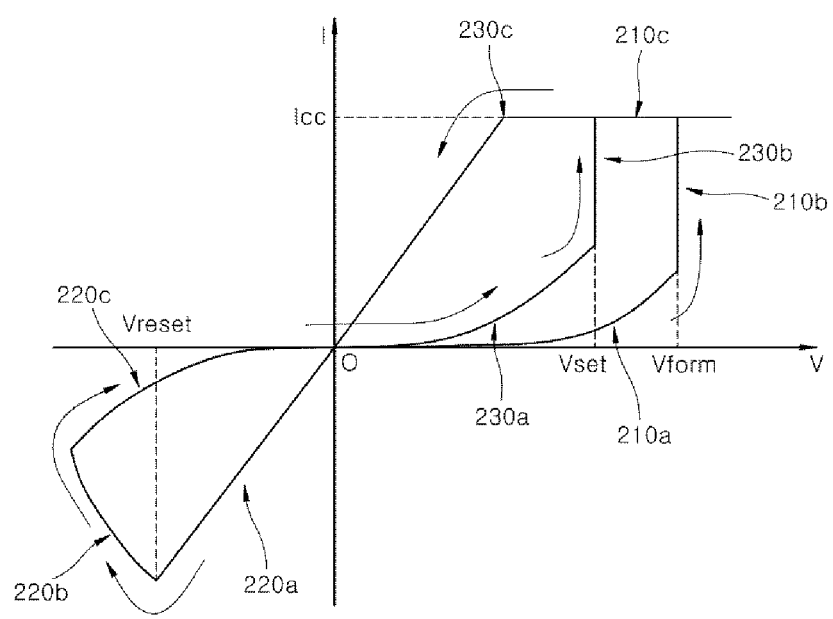
FIG. 2B is a view schematically illustrating electrical characteristics of a resistance change element according to an embodiment of the present disclosure.

FIG. 2A is a view schematically illustrating a method of operating a resistance change element according to an embodiment of the present disclosure. FIG. 2B is a view schematically illustrating electrical characteristics of a resistance change element according to an embodiment of the present disclosure. The resistance change element to be described with reference to FIGS. 2A and 2B may be substantially the same as the resistance change element 10A of the resistance change device 1 described above and with reference to FIG. 1.

Referring to FIGS. 2A and 2B, a first voltage Va may be applied between a first electrode 110 and a second electrode 130. In an embodiment, the first voltage Va may be an operating voltage for forming an initial conductive filament after manufacturing of the resistance change element 10A. The application of the first voltage Va may be performed by applying a positive bias that can vary in magnitude to the second electrode 130, while the first electrode 110 is grounded or is maintained at a predetermined potential. As illustrated in FIG. 2B, when the first voltage Va is increased from 0 V while increasing the magnitude of the positive bias, an operating current may gradually increase along portion 210a of the graph as it encounters a relatively high resistance state. When the first voltage reaches a forming voltage Vform, the operating current may increase relatively rapidly along portion 210b of the graph. Accordingly, the resistance state of the resistance switching layer 120 switches from the relatively high resistance state to a low resistance state. In FIG. 2B, the upper limit value of the rapidly increasing current is limited to a compliance current Icc.

As an example, the change in the resistance state of the resistance switching layer 120 can be described as follows. As the positive bias applied to the second electrode 130 increases, metal oxidizes into metal ions, which also increases in the metal supply layer 132. As a result of the oxidation reaction, the generated metal ions can move into the resistance switching layer 120. The metal ions combine with electrons provided from the first electrode 110 such that the metal ions may be reduced to elemental metal in the resistance switching layer 120. The metal may grow or accumulate into a conductive filament spanning from the first electrode 110 toward the metal supply layer 132. When the conductive filament connects the first electrode 110 to the metal supply layer 132, the resistance state of the resistance switching layer 120 switches from a high resistance state to a low resistance state.

Meanwhile, when the first voltage Va is reduced to 0 V after the resistance state of the resistance switching layer 120 is changed to the low resistance state, the operating current may decrease along portion 210c of the graph in FIG. 2B. Even after the applied first voltage is removed, the conductive filament remains formed in the resistance switching layer 120, so that the resistance switching layer 120 can maintain the low resistance state.

In another embodiment, a second voltage may be applied to the resistance switching layer 120 while the layer is in the low resistance state. The application of the second voltage may consist of applying a negative bias that can vary in magnitude to the second electrode 130, while the first electrode 110 is grounded or is maintained at a predetermined potential. As illustrated in FIG. 2B, when the second voltage is increased in a negative direction from 0 V, thus increasing the magnitude of the negative bias, the operating current can increase along portion 220a of the graph. When the second voltage reaches a reset voltage Vreset, the operating current can be rapidly reduced along portion 220b of the graph. Accordingly, it can be seen that the resistance state of the resistance switching layer 120 is switched from the relatively low resistance state to the high resistance state.

As an example, the change in the resistance of the resistance switching layer 120 can be described as follows. As the magnitude of the negative bias applied to the second electrode 130 increases, the operating current flowing through a conductive filament in the resistance switching layer 120 may increase. Joule heat generated by the operating current may oxidize the metal in the conductive filament to form metal ions, and the metal ions can move or migrate into the resistance switching layer 120. As a result, at least a portion of the conductive filament may be degraded or removed. As the portion of the conductive filament is degraded, the electrical connection between the first electrode 110 and the metal supply layer 132 may be disconnected or cut off and the resistance state of the resistance switching layer 120 may be changed from the low resistance state to the high resistance state.

As the magnitude of the second voltage is decreased to 0 V after the resistance state of the resistance switching layer 120 is changed to the high resistance state, the operating current may decrease along portion 220c of the graph in FIG. 2B. Even after the second voltage is removed, the conductive filament may remain in a state of being disconnected in the resistance switching layer 120, so that the resistance switching layer 120 may remain in the high resistance state.

In yet another embodiment, a third voltage may be applied to the resistance switching layer 120 in which a conductive filament is at least partially disconnected. The application of the third voltage may be performed by applying a positive bias that can vary in magnitude to the second electrode 130 as the first electrode 110 is grounded or is maintained at a predetermined or set potential. As illustrated in FIG. 2B, when the third voltage increases while increasing the magnitude of the positive bias, the operating current may increase along portion 230a of the graph. When the applied third voltage reaches a set voltage Vset, the operating current may increase sharply along portion 230b of the graph. Accordingly, the resistance state of the resistance switching layer 120 switches from the high resistance state to the low resistance state at a lower voltage than Vform.

As an example, the change in the resistance of the resistance switching layer 120 can be described as follows. As the magnitude of the positive bias applied to the second electrode 130 increases, the amount of metal ions supplied from the metal supply layer 132 increases. Electrons provided to the resistance switching layer 120 begin to accumulate at the tip of the disconnected filament following the bias of the third voltage through the remaining filament structure. Accordingly, the reduction of the metal ions to metal elements proceeds from the tip of the conductive filament, and the conductive filament can be restored between the first electrode 110 and the metal supply layer 132. As a result, the resistance state of the resistance switching layer 120 can be changed from the high resistance state to the low resistance state. Since only a portion of the conductive filament is restored, the magnitude of the set voltage Vset shown in FIG. 2B may be smaller than the magnitude of the forming voltage Vform.

Meanwhile, the third voltage is decreased to 0 V after the resistance state of the resistance switching layer 120 is switched to the low resistance state, the operating current may decrease along portion 230c of the graph in FIG. 2B. Even after the applied third voltage is removed, the conductive filament remains formed in the resistance switching layer 120, so that the resistance switching layer 120 can retain a low resistance state.

Figure 3A:
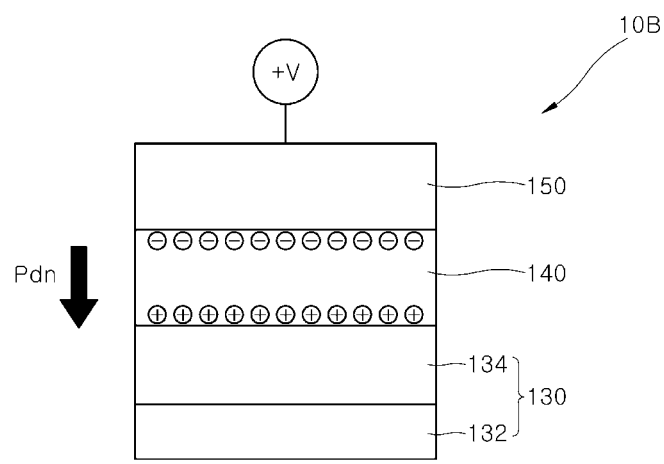
FIGS. 3A and 3B are views schematically illustrating a method of operating a ferroelectric element according to an embodiment of the present disclosure.
Figure 3B:
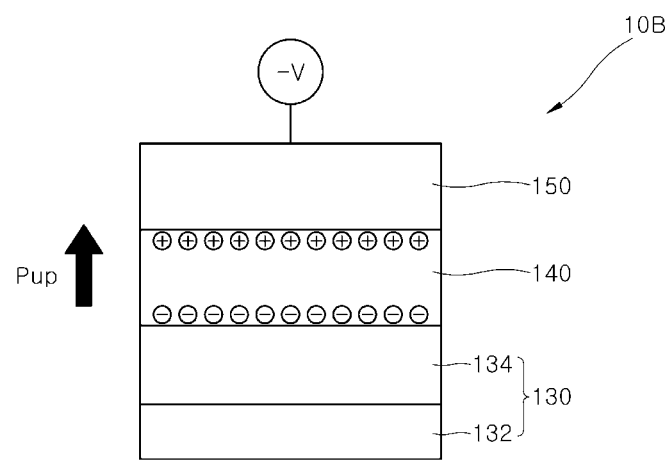
Figure 3C:
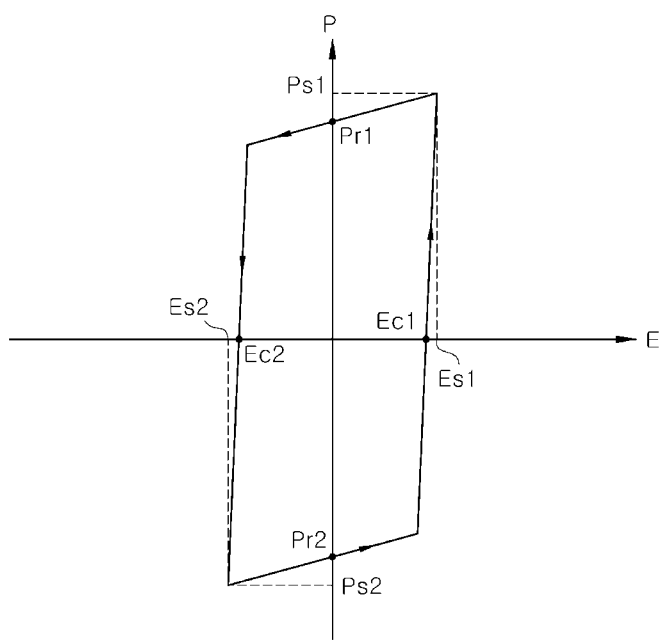
FIG. 3C is a view schematically illustrating an electrical property of a ferroelectric element according to an embodiment of the present disclosure.

FIGS. 3A and 3B are views schematically illustrating a method of operating a ferroelectric element according to an embodiment of the present disclosure. FIG. 3C is a view schematically illustrating electrical characteristics of the ferroelectric element according to an embodiment of the present disclosure. The ferroelectric element to be described with reference to FIGS. 3A to 3C may be substantially the same as the ferroelectric element 10B of the resistance change device 1 described above and with reference to FIG. 1.

Referring to FIG. 3A, a first voltage +V may be applied between a second electrode 130 and a third electrode 150. In an embodiment, the application of the first voltage +V may be performed by applying a positive bias that can vary in magnitude to the third electrode 150, while the second electrode 130 is grounded or is maintained at a predetermined potential. As shown in FIG. 3C, when the first voltage +V increases in a positive direction from 0 V, and the first voltage +V has a voltage value corresponding to an electric field equal to or higher than a first coercive electric field Ec1, polarization having a first polarization orientation Pdn as shown in FIG. 3A starts forming in a ferroelectric layer 140. Here, the first polarization orientation Pdn may indicate a directionality of the polarization from the third electrode 150 toward the second electrode 130.

Meanwhile, when the applied first voltage +V is increased to a voltage value corresponding to an electric field equal to or high a first saturation electric field Es1, polarization having a first saturation polarization value Ps1 may be formed in the ferroelectric layer 140. Thereafter, when the applied first voltage +V is decreased to 0 V, a remanent polarization having a first saturation remanent polarization Pr1 results in the ferroelectric layer 140. The polarization having the first saturation polarization value Ps1 and the polarization having the first saturation remanent polarization value Pr1 may each have the first polarization orientation Pdn. When polarization having the first polarization orientation Pdn is formed in the ferroelectric layer 140, positive electric charges may be attracted to an inner region of the ferroelectric layer 140 near an interface between the ferroelectric layer 140 and the electrode layer 134 and negative electric charges may be attracted towards an inner region of the ferroelectric layer 140 near an interface between the ferroelectric layer 140 and the third electrode 150.

Meanwhile, referring to FIG. 3B, a second voltage −V may be applied between the second electrode 130 and the third electrode 150. In an embodiment, the application of the second voltage −V may be performed by applying a negative bias that can vary in magnitude to the third electrode 150, while in a state where the second electrode 130 is grounded or is maintained at a predetermined potential. As shown in FIG. 3C, when the second voltage −V is increased in a negative direction from 0 V, and the second voltage −V has a voltage value corresponding to an electric field equal to or higher a second coercive electric field Ec2, polarization having a second polarization orientation Pup as shown in FIG. 3B starts forming in the ferroelectric layer 140. Here, the second polarization orientation Pup may mean a directionality of the polarization from the second electrode 130 toward the third electrode 150.

As shown in FIG. 3C, when the applied second voltage −V is increased in a negative direction to a voltage value corresponding to an electric field equal to or higher a second saturation electric field Es2, polarization having a second saturation polarization value Ps2 may be formed in the ferroelectric layer 140. Thereafter, when the applied second voltage −V is decreased to 0 V, remanent polarization having a second saturation remanent polarization Pr2 remains in the ferroelectric layer 140. The polarization having the second saturation polarization value Ps2 and the polarization having the second saturation remanent polarization value Pr2 may each have the second polarization orientation Pup. When the polarization having the second polarization orientation Pup is formed in the ferroelectric layer 140, the polarization may cause arrangement of negative electric charges in an inner region of the ferroelectric layer 140 near an interface between the ferroelectric layer 140 and the electrode layer 134, and positive electric charges in an inner region of the ferroelectric layer 140 near an interface between the ferroelectric layer 140 and the third electrode 150.

Figure 4A:
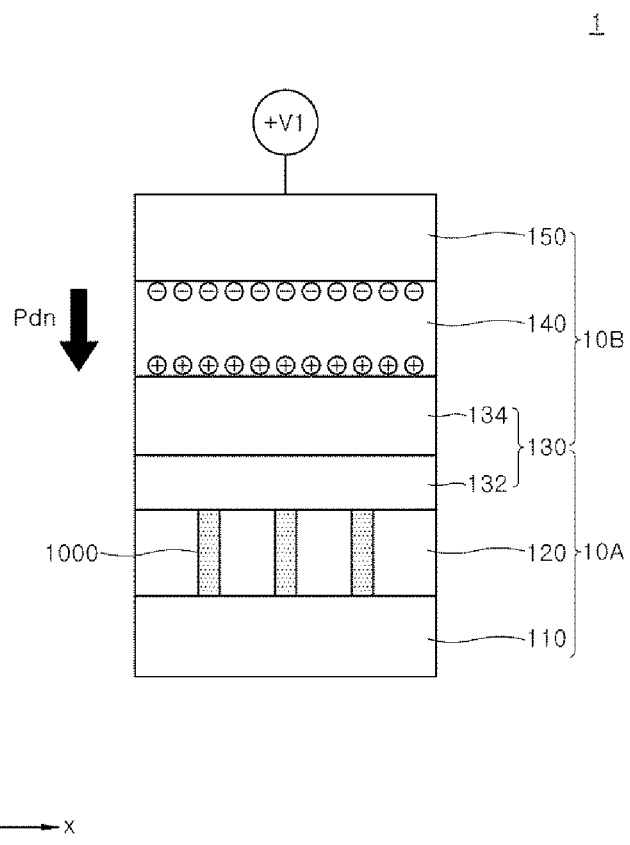
FIG. 4A is a view schematically illustrating a first switching operation of a resistance change device according to an embodiment of the present disclosure.
Figure 4B:
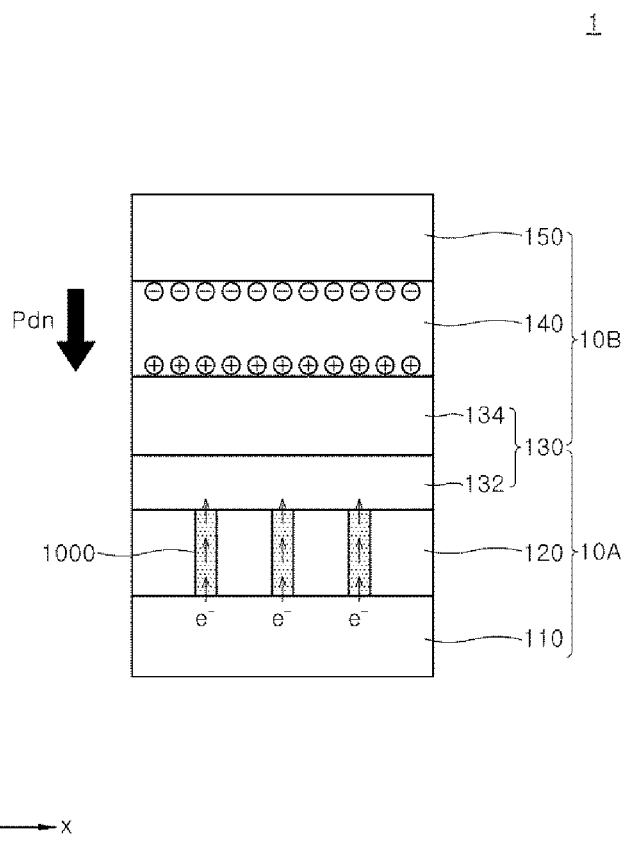
FIG. 4B is a view schematically illustrating an electrical state after a first switching operation of a resistance change device according to an embodiment of the present disclosure.

FIG. 4A is a view schematically illustrating a first switching operation of a resistance change device according to an embodiment of the present disclosure, and FIG. 4B is a view schematically illustrating an electrical state after the first switching operation of the resistance change device, according to an embodiment of the present disclosure. Configurations of the resistance change device, a resistance change element, and a ferroelectric element to be described with reference to FIGS. 4A and 4B may be substantially the same as configurations of the resistance change device 1, the resistance change element 10A, and the ferroelectric element 10B described above and with reference to FIGS. 1, 2A, 2B, 3A and 3B.

Referring to FIG. 4A, a first switching voltage +V1 may be applied between a first electrode 110 and a third electrode 150. In an embodiment, the application of the first switching voltage +V1 results from applying a positive bias that can vary in magnitude to the third electrode 150, in a state where the first electrode 110 is grounded or the first electrode 110 is maintained at a predetermined potential. As an example, the first switching operation may be a forming operation for forming an initial conductive filament 1000 after manufacture of the resistance change device 1.

In an embodiment, when the first switching voltage +V1 is applied to the resistance change device 1, a voltage applied to the resistance change element 10A may have a magnitude equal to or greater than the forming voltage Vform described above and with reference to FIGS. 2A and 2B. Thus, metal ions supplied from a metal supply layer 132 that transition into a resistance switching layer 120, and electrons provided from the first electrode 110, are combined so that the conductive filament 1000 can be formed in the resistance switching layer 120. The conductive filament 1000 electrically connects the first electrode 110 to the metal supply layer 132, so that the resistance state of the resistance switching layer 120 can be switched from a relatively high resistance state to a relatively low resistance state. In addition, when the first switching voltage +V1 is applied to the resistance change device 1, a voltage applied to the ferroelectric element 10B may have a magnitude corresponding to an electric field equal to or higher than the first coercive electric field Ec1 described above and with reference to FIGS. 3A and 3C. Accordingly, polarization having a first polarization orientation Pdn may be formed in a ferroelectric layer 140.

Referring to FIG. 4B, the first switching voltage +V1 may be removed from the resistance change device 1. The conductive filament 1000 may remain in the resistance switching layer 120, so that the electrical resistance of the resistance switching layer 120 can be maintained in the lower resistance state. In addition, the remanent polarization having the first polarization orientation Pdn may remain in the ferroelectric layer 140. The magnitude of the remanent polarization is determined by a magnitude of the voltage provided to the ferroelectric element 10B. In an embodiment, when the voltage corresponding to an electric field equal to or higher than the first saturation electric field Es1 is provided to the ferroelectric element 10B and then the voltage is removed from the ferroelectric element 10B, described above and with reference to FIG. 3C, the remanent polarization that has the first saturation remanent polarization Pr1 may be obtained. In another embodiment, when the voltage corresponding to an electric field equal to or higher than the first coercive electric field Ec1, but below the first saturation electric field Es1 is provided to the ferroelectric element 10B, described above and with reference to FIG. 3C, the remanent polarization of between zero (0) and the first saturation remanent polarization Pr1 may be obtained.

Referring again to FIG. 4B, the remanent polarization may cause arrangement of positive electric charges in an inner region of the ferroelectric layer 140 near an interface between the ferroelectric layer 140 and the electrode layer 134, and negative electric charges in an inner region of the ferroelectric layer 140 near an interface between the ferroelectric layer 140 and the third electrode 150. The positive electric charges and the negative electric charges in ferroelectric layer 140 can form an electric field. In an embodiment, the positive electric charges forming the electric field may apply an attractive force to electrons in the first and second electrodes 110 and 130 and resistance switching layer 120. As a result, the attractive force can induce an electron flow from the first electrode 110 into the metal supply layer 132 through the conductive filament 1000.

Notwithstanding the above description, if the ferroelectric layer 140 is not disposed on the second electrode 130, then electrons may not flow from the first electrode 110 into the metal supply layer 132 through the conductive filament 1000 after the first switching voltage V1 is removed. Electrons are not introduced into the conductive filament 1000, and the metal elements in the conductive filament 1000 may be oxidized to metal ions and the metal ions may move into the resistance switching layer 120. As a result, at least a portion of the conductive filament 1000 may be disassembled due to metal oxidation, and any information retention characteristic that relies on the stability of retaining a low resistance state of the resistance switching layer 120 may be degraded. But, in an embodiment of the present disclosure, the electric field formed by the remanent polarization after the first switching voltage V1 is removed can assist the first electrode 110, the conductive filament 1000 and the second electrode 130 remaining in an electrically neutral state. Specifically, the internal electric field can suppress the oxidation of the metal elements in the conductive filament 1000 by substantially continuously inducing the flow of electrons through the conductive filament 1000. That is, the electrons in the first electrode 110 are substantially continuously provided to the conductive filament 1000 by the electric field. As a result, the structural reliability or integrity of the conductive filament 1000 is improved, leading to the improvement of the information retention characteristics desired by resistance switching layer 120 maintaining a low resistance state.

Figure 5A:
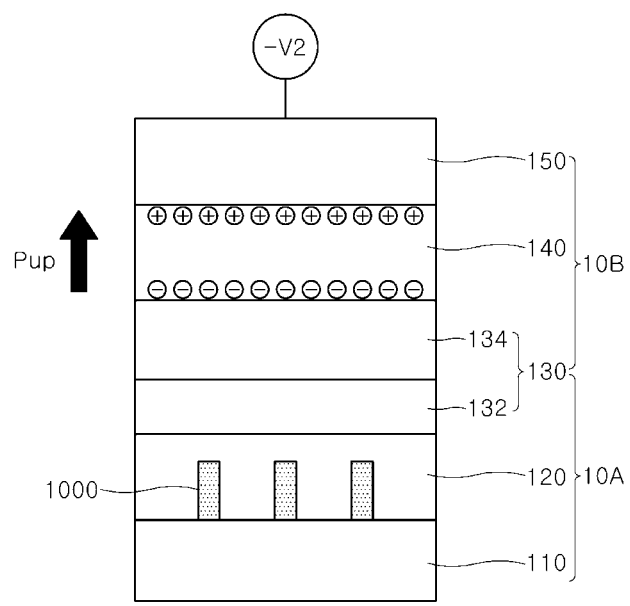
FIG. 5A is a view schematically illustrating a second switching operation of a resistance change device according to an embodiment of the present disclosure.
Figure 5B:
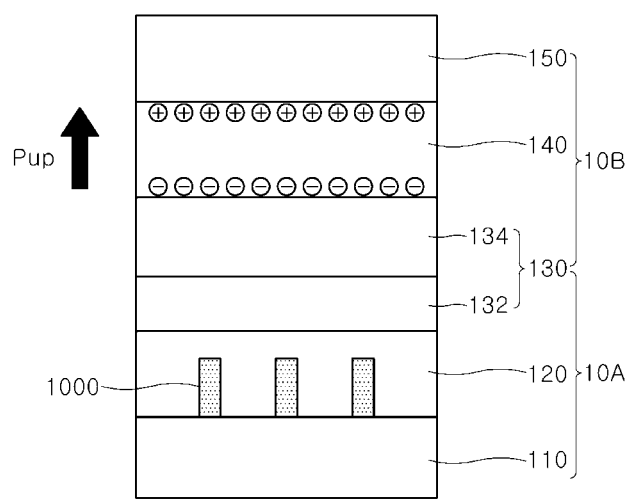
FIG. 5B is a view schematically illustrating an electrical state after a second switching operation of a resistance change device according to an embodiment of the present disclosure.

FIG. 5A is a view schematically illustrating a second switching operation of a resistance change device according to an embodiment of the present disclosure, and FIG. 5B is a view schematically illustrating an electrical state after the second switching operation of the resistance change device according to an embodiment of the present disclosure. A configuration of the resistance change device, a resistance change element and, a ferroelectric element to be described with reference to FIGS. 5A and 5B may be substantially the same as a configuration of the resistance change device 1, the resistance change element 10A, and the ferroelectric element 10B described above and with reference to FIGS. 1, 2A, 2B, 3A and 3B.

Referring to FIG. 5A, a second switching voltage −V2 may be applied between a first electrode 110 and a third electrode 150. In an embodiment, the application of the second switching voltage may be performed by applying a negative bias to the third electrode 150, while the first electrode 110 is grounded or is maintained at a predetermined potential.

In an embodiment, when the second switching voltage −V2 is applied to the resistance change device 1, a voltage applied to the resistance change element 10A may have a magnitude greater than or equal to the reset voltage Vreset described above and with reference to FIGS. 2A and 2B. Accordingly, at least a portion of the conductive filament 1000 in the resistance switching layer 120 may be disconnected or degraded. As a result, the resistance state of the resistance switching layer 120 can be switched from a lower resistance state to a higher resistance state. When the second switching voltage −V2 is applied to the resistance change device 1, a voltage applied to the ferroelectric element 10B may have a magnitude corresponding to an electric field equal to or higher than the second coercive electric field Ec2 described above and with reference to FIGS. 3A and 3C. Accordingly, polarization having the second polarization orientation $P_{up}$ may be formed in the ferroelectric layer 140. The operation of applying the second switching voltage −V2 to the resistance change device 1 can be referred to as a reset operation.

Referring to FIG. 5B, the second switching voltage −V2 may be removed from the resistance change device 1. The conductive filament 1000 may remain in a disconnected or degraded state in the resistance switching layer 120, so that the electrical resistance of the resistance switching layer 120 may be maintained in the higher resistance state. In addition, the remanent polarization having the second polarization orientation Pup may remain in the ferroelectric layer 140. As described above and with reference to FIG. 4B, a magnitude of the remanent polarization is determined by a magnitude of the voltage provided to the ferroelectric element 10B.

Referring again to FIG. 5B, the remanent polarization may cause arrangement of negative electric charges in an inner region of the ferroelectric layer 140 near an interface between the ferroelectric layer 140 and the electrode layer 134, and positive electric charges in an inner region of the ferroelectric layer 140 near an interface between the ferroelectric layer 140 and in contact with the third electrode 150. Separated, the positive electric charges and the negative electric charges may form an electric field. The negative electric charges may act electric force on charges in the first and second electrode 110 and 130 and resistance switching layer 120. However, since the first and second electrodes 110 and 130 are electrically insulated from each other due to the disconnection of the conductive filament 1000, the electric field may not act an electric force that improves the structural stability of the conductive filament 1000.

Figure 6A:
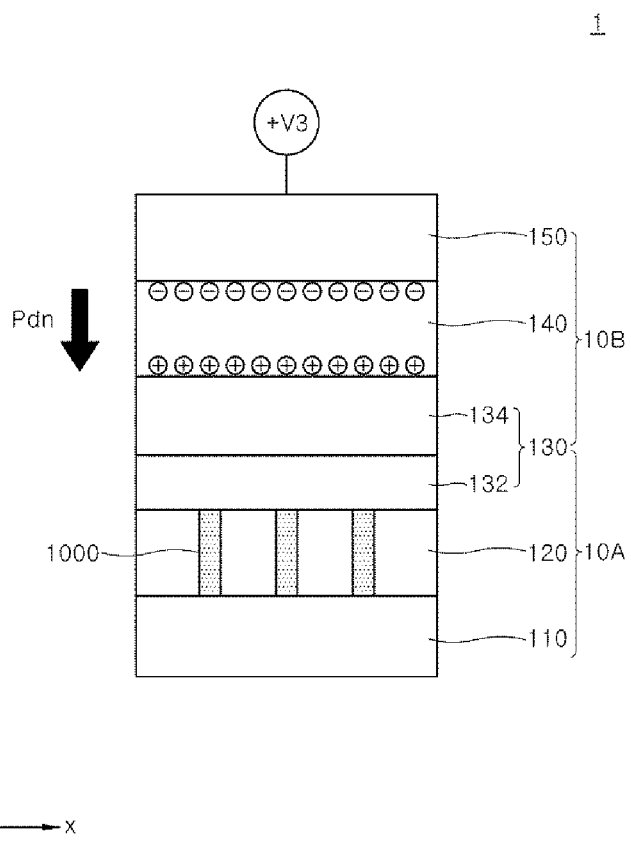
FIG. 6A is a view schematically illustrating a third switching operation of a resistance change device according to an embodiment of the present disclosure.
Figure 6B:
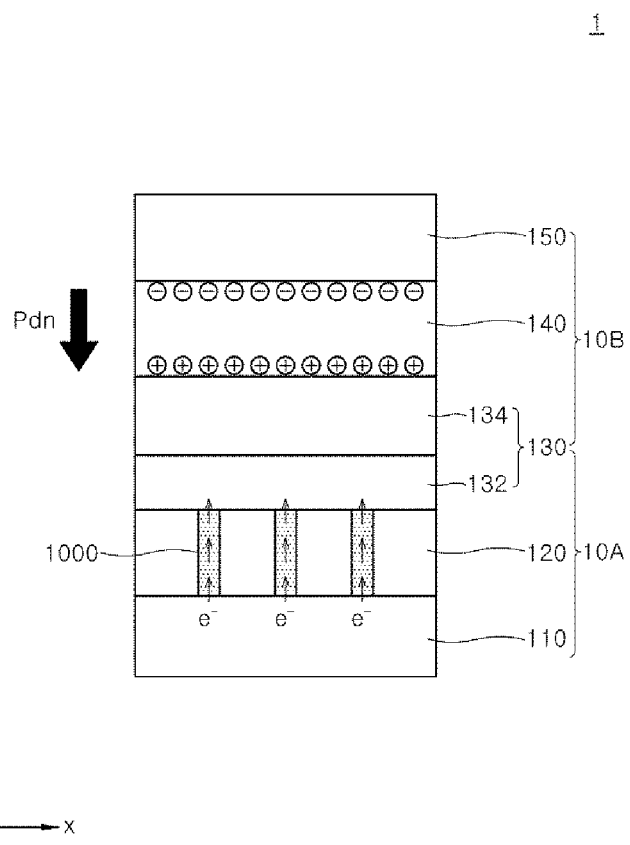
FIG. 6B is a view schematically illustrating an electrical state after a third switching operation of a resistance change device according to an embodiment of the present disclosure.

FIG. 6A is a view schematically illustrating a third switching operation of a resistance change device according to an embodiment of the present disclosure, and FIG. 6B is a view schematically illustrating an electrical state after the third switching operation of the resistance change device according to an embodiment of the present disclosure. Configurations of a resistance change device, a resistance change element and a ferroelectric element to be described with reference to FIGS. 6A and 6B may be substantially the same as configurations of the resistance change device 1, resistance change element 10A, and ferroelectric element 10B described above and with reference to FIGS. 1, 2A, 2B, 3A and 3B.

Referring to FIG. 6A, a third switching voltage +V3 may be applied between a first electrode 110 and a third electrode 150. In an embodiment, the application of the third switching voltage +V3 may be performed by applying a negative bias to the third electrode 150 in a state in which the first electrode 110 is grounded or the first electrode 110 is maintained at a predetermined potential.

In an embodiment, when the third switching voltage +V3 is applied to the resistance change device 1, a voltage applied to the resistance change element 10A may have a magnitude greater than or equal to the set voltage Vset described above and with reference to FIGS. 2A and 2B. As a result, the disconnected conductive filament 1000 described above and with reference to FIGS. 5A and 5B can be restored in the resistance switching layer 120. Specifically, metal ions can be introduced into the resistance switching layer 120 from the metal supply layer 132 by the applied voltage, and electrons can migrate to or be provided to a tip of the conductive filament 1000, which was disconnected from the first electrode 110. The metal ions and the electrons may combine with each other, so that metal can grow from the tip of the conductive filament 1000. In addition, the third switching voltage +V3 can provide a voltage corresponding to an electric field equal to or higher than the first coercive electric field Ec1 described above and with reference to FIGS. 3A and 3C to the ferroelectric element 10B. The voltage can switch the polarization of the ferroelectric layer 140 from the second polarization orientation Pup described above and with reference to FIGS. 5A and 5B to the first polarization orientation Pdn. Consequently, the operation of applying the third switching voltage +V3 to the resistance change device 1 can be referred to as a set operation.

Referring to FIG. 6B, the third switching voltage +V3 may be removed from the resistance change device 1. The conductive filament 1000 may remain in the resistance switching layer 120, so that the electrical resistance of the resistance switching layer 120 stays in the low resistance state. In addition, the remanent polarization having the first polarization orientation Pdn remains in the ferroelectric layer 140, so that positive electric charges may be arranged in the inner region of the ferroelectric layer 140 near the interface between the ferroelectric layer 140 and the electrode layer 134, and negative electric charges may be arranged in the inner region of the ferroelectric layer 140 near the interface between the ferroelectric layer 140 and the third electrode 150. In an embodiment, an electric field formed by the positive electric charges can continuously induce the inflow of electrons from the first electrode 110 into the metal supply layer 132 through the conductive filament 1000. That is, the electrons in the first electrode 110 are substantially continuously provided into the conductive filament 1000 by the electric field. As a result, the oxidation of the metal in the conductive filament 1000 can be suppressed so that the structural reliability of the conductive filament 1000 can be improved, and the information retention characteristic corresponding to a low resistance state of the resistance switching layer 120 can be improved.

Figure 7:
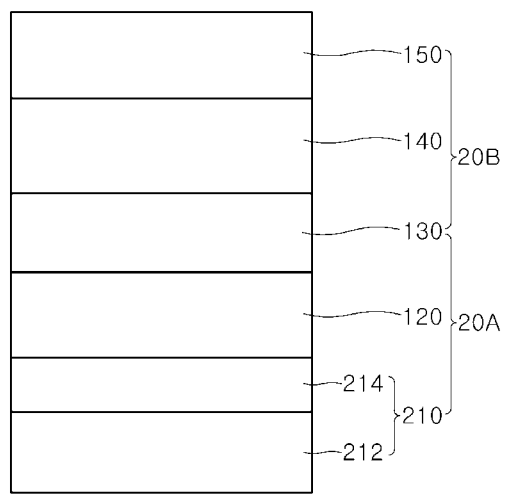
FIG. 7 is a cross-sectional view schematically illustrating a resistance change device according to an embodiment of the present disclosure.
Figure 8A:
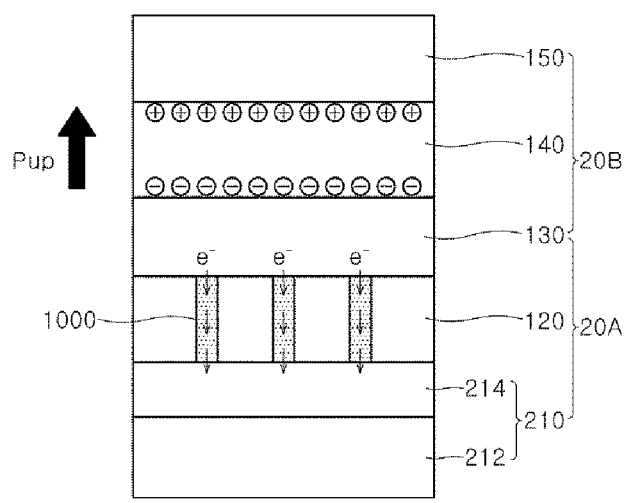
FIGS. 8A and 8B are views representing electrical characteristics of the resistance change device of FIG. 7.
Figure 8B:
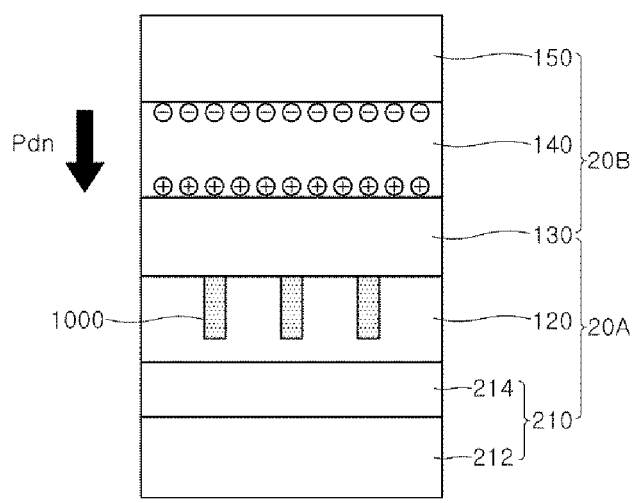

FIG. 7 is a cross-sectional view schematically illustrating a resistance change device 2 according to another embodiment of the present disclosure. FIGS. 8A and 8B are views representing electrical characteristics of the resistance change device 2 of FIG. 7.

Referring to FIG. 7, the resistance change device 2 may include a resistance change element 20A and a ferroelectric element 20B. The resistance change element 20A may include a first electrode 210, a resistance switching layer 120 and a second electrode 130. A configuration of the resistance change element 20A may be substantially the same as a configuration of the resistance change element 10A described above and with reference to FIG. 1 except that the first electrode 210 has a metal supply layer 214 in contact with the resistance switching layer 120 in place of the second electrode 130. Configurations of an electrode layer 212 and the second electrode 130 may be substantially the same as the configurations of the electrode layer 134 and the first electrode 110 of the resistance change element 10A described above and with reference to FIG. 1. However, in an embodiment, a thickness of the electrode layer 212 may be less than a thickness of the first electrode 110 of FIG. 1, and a thickness of the second electrode 130 may be greater than a thickness of the electrode layer 134 of FIG. 1. A configuration of the ferroelectric element 20B may be substantially the same as a configuration of the ferroelectric element 10B described above and with reference to FIG. 1.

Referring to FIG. 8a, a first switching voltage may be applied between the first electrode 210 and the third electrode 150, and then removed. In an embodiment, the application of the first switching voltage may be performed by applying a positive bias to the first electrode 210 in a state in which the third electrode 150 is grounded or the third electrode 150 is maintained at a predetermined potential.

The first switching voltage may be a voltage equal to or higher than the forming voltage or the set voltage described above and with reference to FIGS. 4A and 4B or FIGS. 6A and 6B. When the first switching voltage is applied, metal ions supplied from the metal supply layer 214 move into the resistance change layer 120, and electrons provided from the second electrode 130 may be combined with the metal ions to form a conductive filament 1000 in the resistance switching layer 120. The conductive filament 1000 may connect the metal supply layer 214 to the second electrode 130, so that the resistance state of the resistance change layer 120 can be switched from a relatively high resistance state as an initial state to a low resistance state.

In addition, the first switching voltage may form polarization having a second polarization orientation Pup in the ferroelectric layer 140. When the first switching voltage is applied to the resistance change device 2, a voltage applied to the ferroelectric element 20B may have a magnitude corresponding to an electric field equal to or high than the second coercive electric field Ec2 described above and with reference to FIGS. 3A and 3C. Accordingly, after the first switching voltage is removed, remanent polarization having the second polarization orientation Pup may remain in the ferroelectric layer 140. The remanent polarization may cause arrangement of negative electric charges in an inner region of the ferroelectric layer 140 near an interface between the ferroelectric layer 140 and the second electrode 130, and positive electric charges in an inner region of the ferroelectric layer 140 near an interface between the ferroelectric layer 140 and the third electrode 150. Separated, the positive and negative electric charges may form an electric field. The negative charges may act a repulsive force on electrons and induce the electrons flow from the second electrode 130 into the resistance switching layer 120. The electrons flow into the conductive filament 1000 in the resistance switching layer 120 due to the influence of the electric field and can suppress metal oxidation in the conductive filament 1000. As a result, the structural reliability of the conductive filament 1000 can be improved, and the information retention characteristic associated with the low resistance state of the resistance switching layer 120 can be improved.

Referring to FIG. 8B, a second switching voltage may be applied between the first electrode 210 and the third electrode 150, and then removed. In an embodiment, the application of the second switching voltage may be performed by applying a negative bias to the first electrode 210, when the third electrode 150 is grounded or is maintained at a predetermined potential.

The second switching voltage may be a voltage equal to or higher than the reset voltage described above and with reference to FIGS. 5A and 5B. When the second switching voltage is applied, at least a portion of the conductive filament 1000 may be degraded in the resistance switching layer 120. The resistance state of the resistance switching layer 120 may be switched from the low resistance state to a high resistance state due to the electrical disconnection between first electrode 210 and second electrode 130.

In addition, the second switching voltage may form polarization having the first polarization orientation Pdn in the ferroelectric layer 140. When the second switching voltage is applied to the resistance change device 2, a voltage applied to the ferroelectric element 20B may have a magnitude corresponding to an electric field equal to or higher than the second coercive electric field Ec2 described above and with reference to FIGS. 3A and 3C. Accordingly, after the second switching voltage is removed, remanent polarization having the first polarization orientation Pdn may remain in the ferroelectric layer 140. The remanent polarization may cause arrangement of positive electric charges in an inner region of the ferroelectric layer 140 near an interface between the ferroelectric layer 140 and the second electrode 130, and negative electric charges in an inner region of the ferroelectric layer 140 near an interface between the ferroelectric layer 140 and the third electrode 150. The positive electric charges and the negative electric charges in combination may form an electric field. However, since the first and second electrodes 210 and 130 are electrically insulated from each other due to the dissolution of the conductive filament 1000, the electric field may not act as an electrical force that facilitates the structural stability of the conductive filament 1000.

According to the embodiment of the present disclosure described above, there is provided a resistance change device including a resistance switching layer and a ferroelectric layer. The structural stability of the conductive filament disposed in the resistance switching layer can be improved through development of an electric field from the remanent polarization in the ferroelectric layer. As a result, an information retention characteristic of the resistance change device can also be improved. In addition, standby power and operating power during operation of the resistance change device can be effectively reduced.

In an embodiment, the resistance change device may be applied as a resistive RAM device. The resistive RAM device can store information through a resistance change caused by generation and disconnection of a nonvolatile conductive filament formed in the resistance switching layer. The resistance change device may be applied to a memory device of a cross-point array structure employing the resistive RAM device. The resistive RAM device may constitute a cell of the memory device.

Figure 9:
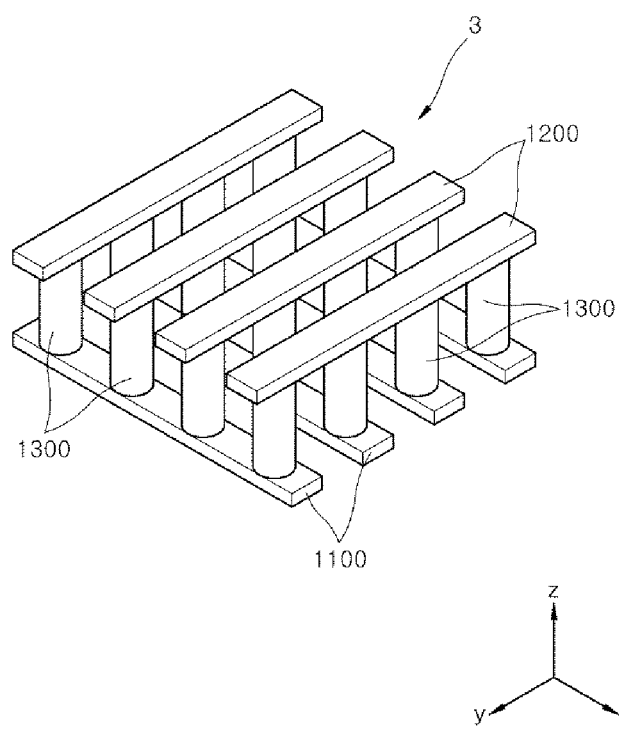
FIG. 9 is a perspective view schematically illustrating a memory device having a cross-point array structure according to an embodiment of the present disclosure.

FIG. 9 is a perspective view schematically illustrating a cross-point array memory device 3 according to an embodiment of the present disclosure. In the cross-point array memory device 3 of FIG. 9, for convenience of illustration, a plurality of insulating layers disposed in the cross-point array memory device and a substrate under the cross-point array memory device 3 are omitted.

Referring to FIG. 9, the cross-point array memory device 3 may include first conductive lines 1100 extending in a first direction (for example, x-direction), second conductive lines 1200 extending in a second direction (for example, y-direction), and pillar-shaped structures 1300 extending in a third direction (for example, z-direction) at regions where the first and second conductive lines 1100 and 1200 overlap. In one illustrated embodiment, the first direction and the second direction are shown as an orthogonal coordinate system orthogonal to each other, but the present disclosure is not limited thereto and various modifications may be made as long as the conditions in which the first direction and the second direction are not parallel. On the other hand, the pillar-shaped structure 1300 may correspond to a unit cell of the cross-point array memory device 3. The pillar-shaped structure 1300 may constitute an array of a plurality of unit cells having a matrix shape along the first and second directions. The pillar-shaped structure 1300 may include the resistance change devices 1 and 2 described above and with reference to FIGS. 1 and 7, respectively.

In another embodiment, the resistance change device may be applied to a logic device. The resistance change device can implement a high on/off ratio through the generation and disconnection of the conductive filament, and can also secure the structural reliability of the conductive filament using remanent polarization, thereby improving the data retention characteristic. In addition, the resistance change device according to an embodiment of the present disclosure is advantageous in that the resistance change device can be implemented as a two-terminal based small-sized device, which facilitates integration. Due to these characteristics, the resistance change device can be easily used in a reconfigurable logic device such as a Field Programmable Gate Array (FPGA).

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A resistance change device comprising:
a first electrode;
a resistance switching layer disposed on the first electrode;
a second electrode disposed on the resistance switching layer;
a ferroelectric layer disposed on the second electrode; and
a third electrode disposed on the ferroelectric layer.
2. The resistance change device of claim 1, wherein the resistance switching layer can be reversibly switched between a low resistance state and a high resistance state, and
wherein the resistance switching layer further comprises a conductive filament connecting the first electrode to the second electrode when the resistance switching layer is in the low resistance state.
3. The resistance change device of claim 2, wherein the ferroelectric layer has a remanent polarization, and wherein the remanent polarization generates an electric field that induces a flow of electrons from any one of the first and second electrodes to the conductive filament.
4. The resistance change device of claim 1, wherein one of the first electrode and the second electrode comprises a metal supply layer in contact with the resistance switching layer.
5. The resistance change device of claim 4, wherein metal ions supplied from the metal supply layer flow into the resistance switching layer.

6. The resistance change device of claim 4, wherein the metal supply layer comprises at least one of copper (Cu), silver (Ag), copper-tellurium (Cu—Te) alloy, and silver-tellurium (Ag—Te) alloy.
7. The resistance change device of claim 1, wherein the resistance switching layer has at least two resistance states and stores one of the at least two resistance states in a nonvolatile manner.
8. The resistance change device of claim 1, wherein the resistance switching layer comprises a chalcogenide-based material or metal oxide.
9. The resistance change device of claim 8, wherein the resistance switching layer comprises at least one selected from the group consisting of aluminum oxide, hafnium oxide, tantalum oxide, titanium oxide, zinc oxide, silicon oxide, silicon nitride, germanium-tellurium (Ge—Te), germanium-selenium-tellurium (Ge—Se—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), and germanium-tellurium-tin-platinum (Ge—Te—Sn—Pt).
10. The resistance change device of claim 1, wherein the ferroelectric layer comprises at least one of hafnium oxide, zirconium oxide and hafnium zirconium oxide.
11. The resistance change device of claim 1, wherein at least one of the first to third electrodes comprises a conductive material, and the conductive material comprises at least one of metal, metal nitride, metal oxide, doped silicon and conductive carbon structure.
12. A resistance change device comprising:
a first electrode, a resistance switching layer, a second electrode, a ferroelectric layer having a remanent polarization, and a third electrode that are sequentially disposed,
wherein the resistance switching layer has a variable electrical resistance depending on whether a conductive filament connecting the first and second electrodes to each other is formed in the resistance switching layer, and
wherein the remanent polarization generates an electric field that induces an inflow of electrons from at least one of the first and second electrodes into the conductive filament when the conductive filament is generated in the resistance switching layer.
13. The resistance change device of claim 12, wherein one of the first electrode and the second electrode comprises a metal supply layer in contact with the resistance switching layer.

14. The resistance change device of claim 13, wherein the conductive filament comprises metal supplied from the metal supply layer.

15. The resistance change device of claim 13, wherein the metal supply layer comprises at least one of copper (Cu), silver (Ag), copper-tellurium (Cu—Te) alloy, and silver-tellurium (Ag—Te) alloy.

16. The resistance change device of claim 12, wherein the resistance switching layer comprises a chalcogenide-based material or metal oxide.

17. The resistance change device of claim 16, wherein the resistance switching layer comprises at least one selected from the group consisting of aluminum oxide, hafnium oxide, tantalum oxide, titanium oxide, zinc oxide, silicon oxide, silicon nitride, germanium-tellurium (Ge—Te), germanium-selenium-tellurium (Ge—Se—Te), indium-selenium (In—Se), antimony-tellurium (Sb—Te), arsenic-tellurium (As—Te), aluminum-tellurium (Al—Te), germanium-antimony-tellurium (Ge—Sb—Te), tellurium-germanium-arsenic (Te—Ge—As), indium-antimony-tellurium (In—Sb—Te), tellurium-tin-selenium (Te—Sn—Se), germanium-selenium-gallium (Ge—Se—Ga), bismuth-selenium-antimony (Bi—Se—Sb), gallium-selenium-tellurium (Ga—Se—Te), tin-antimony-tellurium (Sn—Sb—Te), tellurium-germanium-antimony-sulfur (Te—Ge—Sb—S), tellurium-germanium-tin-oxygen (Te—Ge—Sn—O), tellurium-germanium-tin-gold (Te—Ge—Sn—Au), palladium-tellurium-germanium-tin (Pd—Te—Ge—Sn), indium-selenium-titanium-cobalt (In—Se—Ti—Co), germanium-antimony-tellurium-palladium (Ge—Sb—Te—Pd), germanium-antimony-tellurium-cobalt (Ge—Sb—Te—Co), antimony-tellurium-bismuth-selenium (Sb—Te—Bi—Se), silver-indium-antimony-tellurium (Ag—In—Sb—Te), germanium-antimony-selenium-tellurium (Ge—Sb—Se—Te), germanium-tin-antimony-tellurium (Ge—Sn—Sb—Te), germanium-tellurium-tin-nickel (Ge—Te—Sn—Ni), germanium-tellurium-tin-palladium (Ge—Te—Sn—Pd), and germanium-tellurium-tin-platinum (Ge—Te—Sn—Pt).

18. The resistance change device of claim 12, wherein the ferroelectric layer comprises at least one of hafnium oxide, zirconium oxide and hafnium zirconium oxide.

19. The resistance change device of claim 12, wherein at least one of the first to third electrodes comprises a conductive material, and the conductive material comprises at least one of metal, metal nitride, metal oxide, doped silicon and conductive carbon structure.

20. The resistance change device of claim 12, wherein the remanent polarization includes an inflow of the electrons into the conductive filament to suppress oxidation of the conductive filament.

* * * * *